United States Patent [19]
Kim et al.

[11] Patent Number: 5,886,924
[45] Date of Patent: Mar. 23, 1999

[54] NONVOLATILE SEMICONDUCTOR MEMORY HAVING SUB-ARRAYS FORMED WITHIN POCKET WELLS

[75] Inventors: Dong-Jun Kim; Jung-Dal Choi, both of Suwon, Rep. of Korea

[73] Assignee: Samsung Electronics, Co., Ltd., Suwon, Rep. of Korea

[21] Appl. No.: 965,054

[22] Filed: Nov. 5, 1997

[30] Foreign Application Priority Data

Nov. 5, 1996 [KR] Rep. of Korea .................. 1996-52138

[51] Int. Cl.⁶ .......................... G11C 11/34; H01L 29/788
[52] U.S. Cl. ................. 365/185.11; 365/185.01; 365/187.17; 257/315; 257/316
[58] Field of Search ......................... 365/185.01, 185.11, 365/185.17; 257/315, 316, 317, 318

[56] References Cited

U.S. PATENT DOCUMENTS

| | | | |
|---|---|---|---|
| 4,878,199 | 10/1989 | Mizutani | 365/185 |
| 5,457,652 | 10/1995 | Brahmbhatt | 365/185.06 |
| 5,677,556 | 10/1997 | Endoh | 257/316 |
| 5,751,631 | 5/1998 | Liu et al. | 365/185.01 |

Primary Examiner—Vu A. Le
Attorney, Agent, or Firm—Marger Johnson & McCollom, P.C.

[57] ABSTRACT

Disclosed is a nonvolatile electrically-erasable semiconductor memory having an array of storage cells divided into sub-arrays, where the memory is formed on a semiconductor substrate doped with a first type of conductive impurity having a first well doped with a second type of conductive impurity. The storage cells for each sub-array are formed in a pocket well formed in the first well and doped with the first type of conductive impurity. A programming operation is performed by applying a programming voltage, such as 18 V, to the control gates of only those storage cells that are selected to be programmed, applying a ground level voltage to the pocket well corresponding to the selected storage cells, and applying an anti-programming voltage, such as 7 V, to the pocket wells corresponding to the storage cells that are not selected for programming. An erasing operation is performed by applying a ground level voltage to the control gates of the storage cells selected for erasure, applying an erasing voltage, such as 20 V, to the pocket well corresponding to the selected storage cells, and applying a prescribed voltage, such as from 4 V to 14 V, to the pocket wells corresponding to the storage cells that are not selected for erasure.

15 Claims, 7 Drawing Sheets

FIG. 7

NONVOLATILE SEMICONDUCTOR MEMORY HAVING SUB-ARRAYS FORMED WITHIN POCKET WELLS

BACKGROUND OF THE INVENTION

1. Field of the Invention

The present invention concerns a nonvolatile semiconductor memory and, more particularly, an electrically erasable and programmable read-only memory (EEPROM).

2. Description of the Related Art

As a nonvolatile semiconductor memory device becomes more highly integrated in order to increase storage capacity and raise the operating speed, new problems appear. A nonvolatile semiconductor memory is constructed with a plurality of storage cells (memory cells), which are each composed of a floating gate transistor. Each floating gate transistor, in turn, consists of a floating gate, a control gate, a source and a drain. The storage cells are arranged in a matrix consisting of rows and columns. The control gates for each row of storage cells are all connected to a single shared word line while the drains for each column of storage cells are connected to a common bit line. A memory cell array will thus consist of a plurality of the storage cells together with a plurality of word and bit lines by which data is stored and read from the cells of the array.

In order to enhance the operating speed of a nonvolatile semiconductor memory, the data stored in the storage cells connected with a selected word line are simultaneously read out through the plurality of corresponding bit lines in what is called a page read. The data read out during the page read are stored into a plurality of data latches called page buffers. In contrast, the write operation (programming) is achieved by sequentially storing data into the page buffers through a data input/output (I/O) pad or terminal, and then simultaneously transferring the data stored in the page buffers into the storage cells connected to a selected word line. This method for writing data into a memory array is called page programming. The page read and programming operation are described in further detail in commonly-assigned Korean Laid-Open Patent Publication No. 94-18870 published on Aug. 19, 1994.

To describe the page read, programming and erasing operations in greater detail, page programming data into memory cells is achieved by applying a high level programming voltage, e.g. 18 V, to a word line connected to the control gates of the memory cells and a ground level voltage to the respective bit lines connected with the channels of the memory cells so that the voltage difference between the control gates of the memory cells and the channels causes electrons to penetrate the thin oxide film, otherwise known as the Fowler Nordheim Tunneling phenomenon, in order to reach the floating gate thereby changing the threshold voltage of the transistor controlled by the control gate. The erasing operation is achieved by reversing the process and applying an erasing voltage, typically 20 V, to a large block of memory cells and the ground level voltage to the word line connected to the control gates so that the voltage difference between the transistor wells of the cells and the control gates of the transistors causes the electrons stored in the floating gates to tunnel away from the floating gates in order to discharge the floating gates and once again change the threshold voltage of the transistors in the block. Since the threshold voltage of each memory cell has a negative or positive value depending on whether it is in a programmed or an erased state, the read operation is achieved by applying zero voltage to the control gate of the memory cell and sensing the voltage difference between the drain and source of the cell. This type of nonvolatile semiconductor memory is called flash memory and is described in the papers entitled "A 3.3 V 32 Mb NAND Flash Memory with Incremental Step Pulse Programming Scheme" and "A 35 ns Cycle Time 3.3 V Only 32 Mb NAND Flash EEPROM", IEEE Journal of Solid-State Circuits, Vol.30, No. 11, Nov., 1995.

Figure 1:
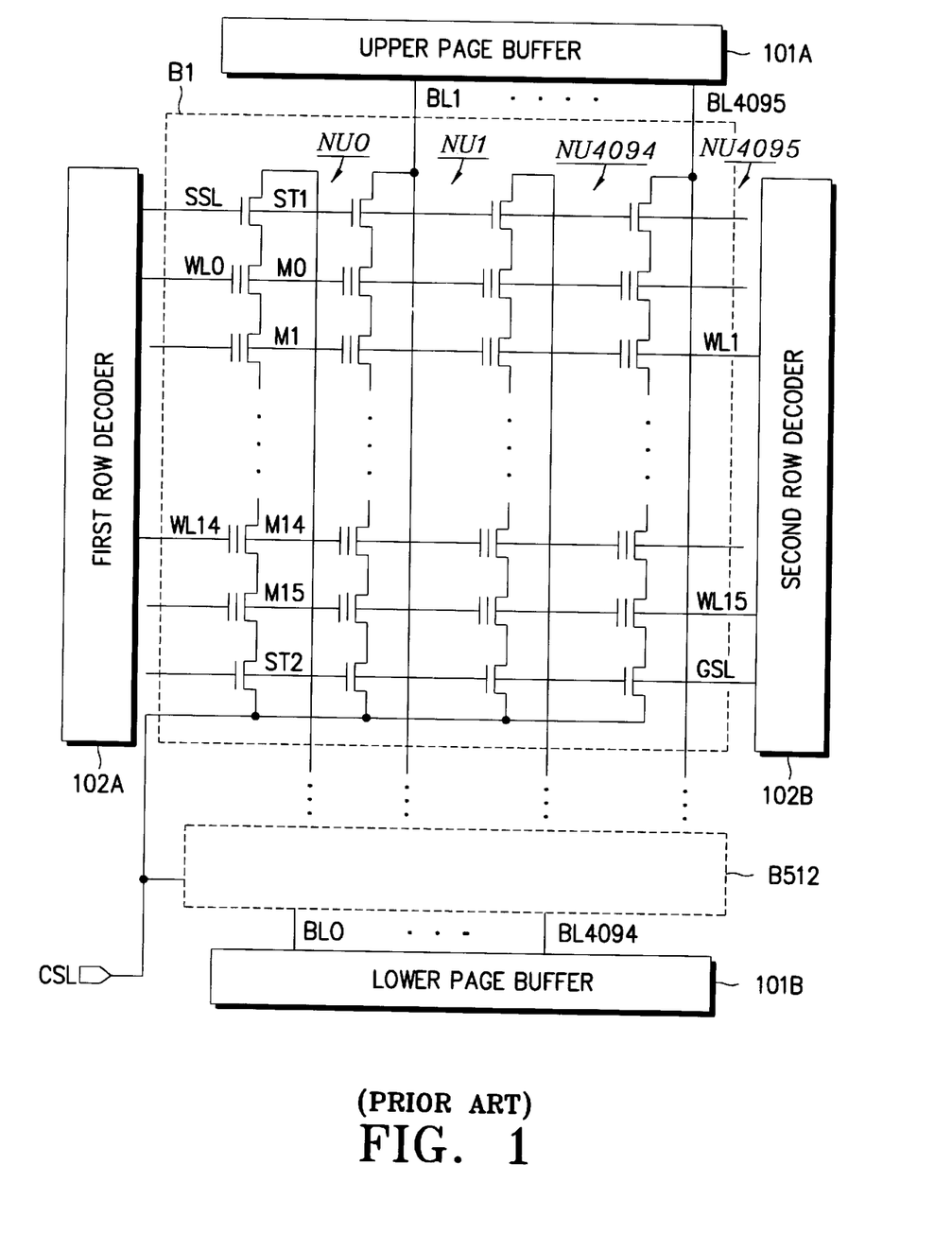
FIG. 1 is a block diagram of the conventional nonvolatile semiconductor memory device illustrating a memory cell array and a control circuit thereof.

FIG. 1 illustrates a conventional memory cell array with a control circuit, where the array has 8,192 rows and 4,096 columns for 32 megabits (4,096×8,192) of memory cells. The memory cell array is divided into blocks B1–B512 of 64K each (4096×512), where block B1 is shown in greater detail. The control gates of the storage cells are connected through 8,192 word lines and the drains are connected through 4,096 bit lines. The block B1 includes NAND cell units NU0, NU1, . . . , NU4095 wherein each of the NAND cell units consists of 16 storage cells M0–M15 connected in series between the source of a first selection transistor ST1 and the drain of a second selection transistor ST2. The drain of each first selection transistor ST1 is connected to a corresponding bit line BL0, BL1, . . . , BL4095 through a resistor (not shown). The source of the second selection transistor ST2 is connected with a common source line CSL.

In each of the row blocks B1–B512, the control gates of the first selection transistors ST1 for each of the NAND units NU0–NU4095 are all commonly coupled to a first selection line SSL. Similarly, the control gates of storage cells M0–M15 of each NAND units NU0–NU4095 are all commonly coupled to a corresponding word line WL0–WL15, respectively. And the control gates of second selection transistors ST2 are all coupled in common to a second selective line GSL.

The first selective line SSL is driven by a first row decoder 102A and the second selective line GSL is driven by a second row decoder 102B. Further, the even numbered word lines WL0, WL2, . . . , WL14 are also driven by the first row decoder 102A while the odd numbered word lines WL1, WL3, . . . , WL15 are driven by the second row decoder 102B. Even numbered bit lines BL0, BL2, . . . , BL4094 are coupled to lower page buffer 101B while odd numbered bit lines BL1, BL3, . . . , BL4095 are coupled to upper page buffer 101A. The upper page buffer 10A and lower page buffer 101B each have internal data latches which temporarily store input data signals received through the input/output pins of the semiconductor memory device in order to perform various functions, such as controlling the execution of data programming operations as well as read-out and erase operations.

Figure 2:
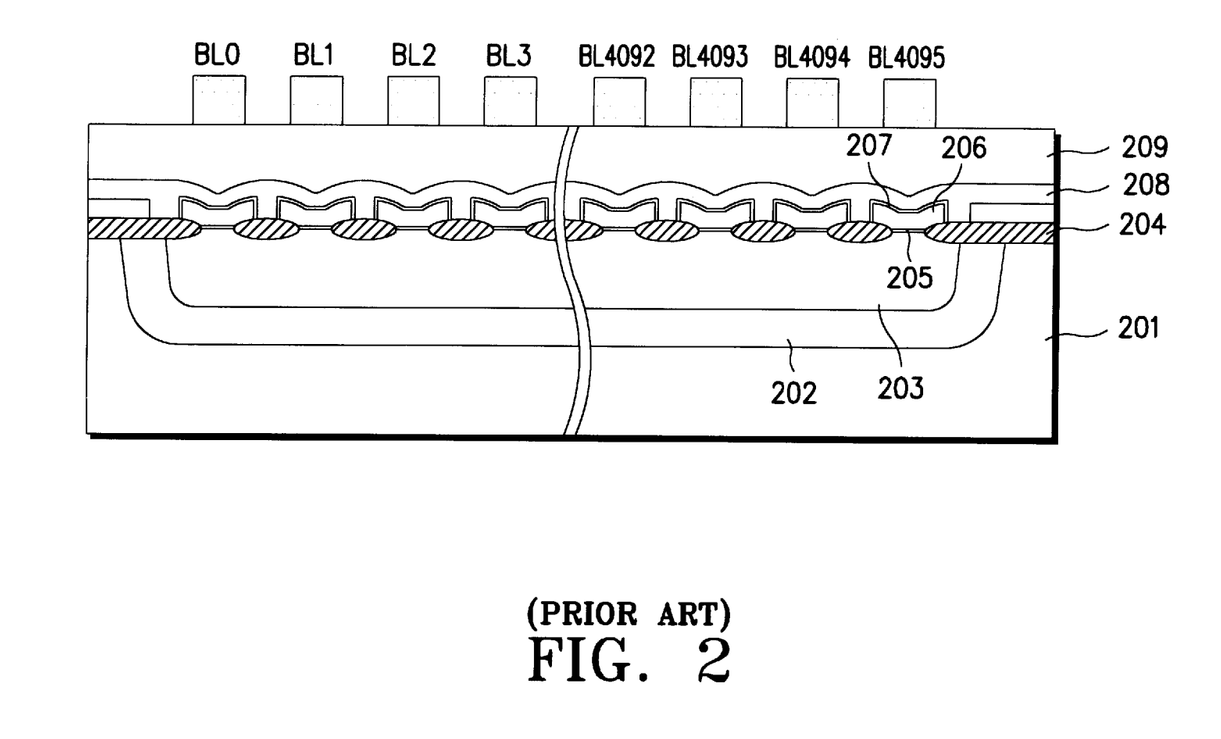
FIG. 2 is a transverse sectional view illustrating the structure of the conventional memory cell array as shown in FIG. 1 according the prior art.

FIG. 2 illustrates the physical structure of a row of stacked memory cells. In the physical structure, a second conductive n-type well 202 is formed on a first conductive p-type semiconductor substrate 201. A first conductive-type pocket well 203 is placed on the second conductive n-type well 202. Each of the memory cells has a floating gate 206 and a control gate 208 in an active region. The individual stacked memory cells are separated from each other by a field insulator film 204. The reference number 208 also represents a word line because all the control gates in a given row are connected to the same word line. The floating gate 206 and control gate 208 are separated from each other by insulator film 207, such as ONO (Oxide/Nitride/Oxide). An insulator film 209 is formed on the word line 208 and the bit lines BL0–BL4095 are formed on top of insulator film 209. The thin oxide film 205 represents the area where electrons tunnel through to the floating gate 206.

In the nonvolatile semiconductor memory of FIG. 2, the second conductive n-type well 202 and the first conductive-type pocket well 203 are electrically connected to each other and a ground potential voltage is applied to them in order to perform data programming operation. The high level programming voltage is applied to the word line 208 connected to the control gates of the memory cells and the data are input through the bitlines BL0–BL4095 which are connected to the channels of the memory cells.

When some of the memory cells connected to a selected word line are not to be programmed, the VCC or higher voltage is directly or indirectly applied to channels corresponding to the memory cells so as to prevent those cells from being programmed.

Note that as the capacity of nonvolatile semiconductor memories is continuously improved by integrating the memories on a very large scale, that there is necessarily a resulting increase in the number of memory cells connected to a single word line and, accordingly, an increase in the number of memory cells that required to not be programmed during a given programming operation. This increase in the number of cells that are not to be programmed leads, in turn, to an increase in the power consumption of the bitlines which supply the channel voltage that prevents the state of the memory cell from being programmed. In addition, when the channel voltage is dropped, the memory cells that are required not to be programmed can be erroneously programmed by the voltage change causing corruption of the stored data.

For a data erasing operation, the ground voltage is applied to the word line 208 connected to the control gates of the memory cells to be erased. The erasing voltage (20 V) is applied to the second conductive n-type well 202 which is electrically connected to the first conductive-type pocket well 203 thereby erasing the data in all the memory cells connected to the word line. The increased level of integration of the memory device results in a larger number of memory cells connected each word line which causes both greater power consumption and a deterioration of the reliability of the device because a larger number of memory cells must be erased or programmed in order to make a correct in a small amount of data.

U.S. Pat. No. 4,878,199 is directed to solving the problems described above for nonvolatile semiconductor memory. The nonvolatile semiconductor memory proposed in U.S. Pat. No. 4,878,199 has opposing first and second conductive-type wells that are formed on a substrate. The first and second wells each simultaneously form the same number of memory cells which are jointly connected to the corresponding bit and word lines. One of the first and second wells forms an auxiliary memory cell array, where a back bias voltage is applied to the auxiliary memory cell array in order to increase the threshold voltage of the memory cells and prevent the redundant data read-out and operating data of the auxiliary memory cell array that is necessary when changing data of the main memory array. Thus memory faults are avoided and the memory device is more reliable.

However, the above method suffers from the disadvantage that two memory cells must be provided for storing one bit of data which cuts the memory density achieved through large scale integration in half. Also, the breakdown voltage at the bit line junction of the auxiliary array must be raised above the value of the bit line voltage plus the back bias voltage in order to prevent breakdown of the memory cell transistors in the auxiliary array.

Generally, in the memory cell array area, a high level erase voltage of 20 V is applied to a large number of memory cells during an erase operation, and is thus transferred to the peripheral circuits outside of the memory cell array, which results in junction breakdown or destruction of the gate oxide films in the peripheral circuits. The entire area of the cell array is formed by n-type wells, and the pocket wells are p-type wells formed inside of the n-type wells so as to prevent the high voltage applied to the p-type wells from being transferred to the peripheral circuitry during the data erasing operation.

However, as the density of nonvolatile semiconductor memory devices is increased to improve capacity, the number of rows and columns of the cell array also increases, thus increasing the length of the word lines. Typically, the word lines of a nonvolatile memory are made of polysilicon which has a sheet which is on the order of several tens of ohms. When the length of the word line is increased, the resistance of the word line also becomes greater so that the programing or read-out voltage drops when it is applied to the farthest memory cells which malfunction as a result. In addition, the erasing operation is performed on the level of blocks B1–B512, which means that an entire block must be erased and reprogrammed in order to correct a single byte of data.

The number of memory cells within the each of NAND units NU0–NU4095 is usually eight or sixteen. In large scale integration, the memory density is increased by using 32 or 64 memory cells in a single NAND unit. The size of a page of memory is usually 512 bytes, whereby the block size is 4K bytes or 8K bytes. Currently, in order to correct one byte of data, the entire memory block of 4K bytes or 8K bytes must be erased and then reprogrammed. This process for data correction is not only complicated and time-consuming, but also shortens the operational life of the memory cells.

Furthermore, the increase in memory density also increases the number of memory cells connected to the same word line which causes the page size to increase. The number of memory cells connected to the unit string also increases resulting in an increase in block size. For example, in the case of a 256 Megabit NAND-type flash memory, the size of a page is 2K bytes, and if the number of memory cells of the unit NAND memory are 32, then the size of a block is 64K bytes.

Also, since the number of cells that must be erased and reprogrammed in order to correct a byte of data is increased, the power consumption to perform an erase is also increased and the cells which are not required to be erased and reprogrammed are considerably deteriorated in terms of the their operational lifetime due to the repeated erasing and reprogramming operations. Furthermore, in the worst case for erasing and reprogramming a block, when only one bit data needs to be reprogrammed and the remaining data are not required to be reprogrammed, the back bias voltage used to prevent cells from being reprogrammed must be applied to all the remaining bit lines, which also leads to power consumption and additional operation time for charging the additional bitlines.

SUMMARY OF THE INVENTION

It is an object of the present invention to provide a nonvolatile semiconductor memory with improved reliability.

It is another object of the present invention to provide a nonvolatile semiconductor memory which requires reduced power to change data.

It is still another object of the present invention to provide a nonvolatile semiconductor memory which may be very highly integrated.

It is further another object of the present invention to provide a nonvolatile semiconductor memory which requires a reduced time for various controls.

An embodiment of a nonvolatile semiconductor memory device according to the present invention includes a semiconductor substrate doped with a first type of conductive impurity and a first well formed in the semiconductor substrate that is doped with a second type of conductive impurity. A plurality of pocket wells is formed in the first well, wherein each of the pocket wells is doped with the first type of conductive impurity, and each pocket well includes a group of storage cells formed in the pocket well. A control circuit is configured to select one of the groups of storage cells formed in the plurality of pocket wells.

Another embodiment of a semiconductor memory device according to the present invention includes a semiconductor substrate doped with a first type of conductive impurity where a plurality of outer pocket wells is formed in the semiconductor substrate that are doped with a second type of conductive impurity. A pocket well is formed within each of the outer pocket wells, where each of the pocket wells is doped with the first type of conductive impurity. A group of storage cells is formed in each pocket well and a control circuit is configured to select one of the groups of storage cells.

An embodiment of a nonvolatile electrically-erasable memory device according to the present invention includes first and second memory sub-arrays, where each sub-array having a plurality of memory cells arranged in a plurality of row blocks, wherein each memory cell includes a control gate and each row block includes a word line coupled to the control gates of all the memory cells in the row block. A row decoder is interposed the first and second memory sub-arrays, the row decoder being coupled to the word lines of the plurality of row blocks in each of the first and second memory sub-arrays.

An embodiment of a method for organizing a memory array according to the present invention includes dividing the memory array into first and second sub-arrays and disposing a row decoder between the first and second sub-arrays.

The present invention will now be described more specifically with reference to the attached drawings. It should be noted that like reference numerals and characters are used in the accompanying drawings to refer to like constituent elements throughout the drawings. Furthermore, the following examples are given only with the purpose to allow those skilled in the art to better understand the present invention and should in no way be construed as a limitation upon the invention itself.

DETAILED DESCRIPTION OF THE PREFERRED EMBODIMENT

Figure 3:
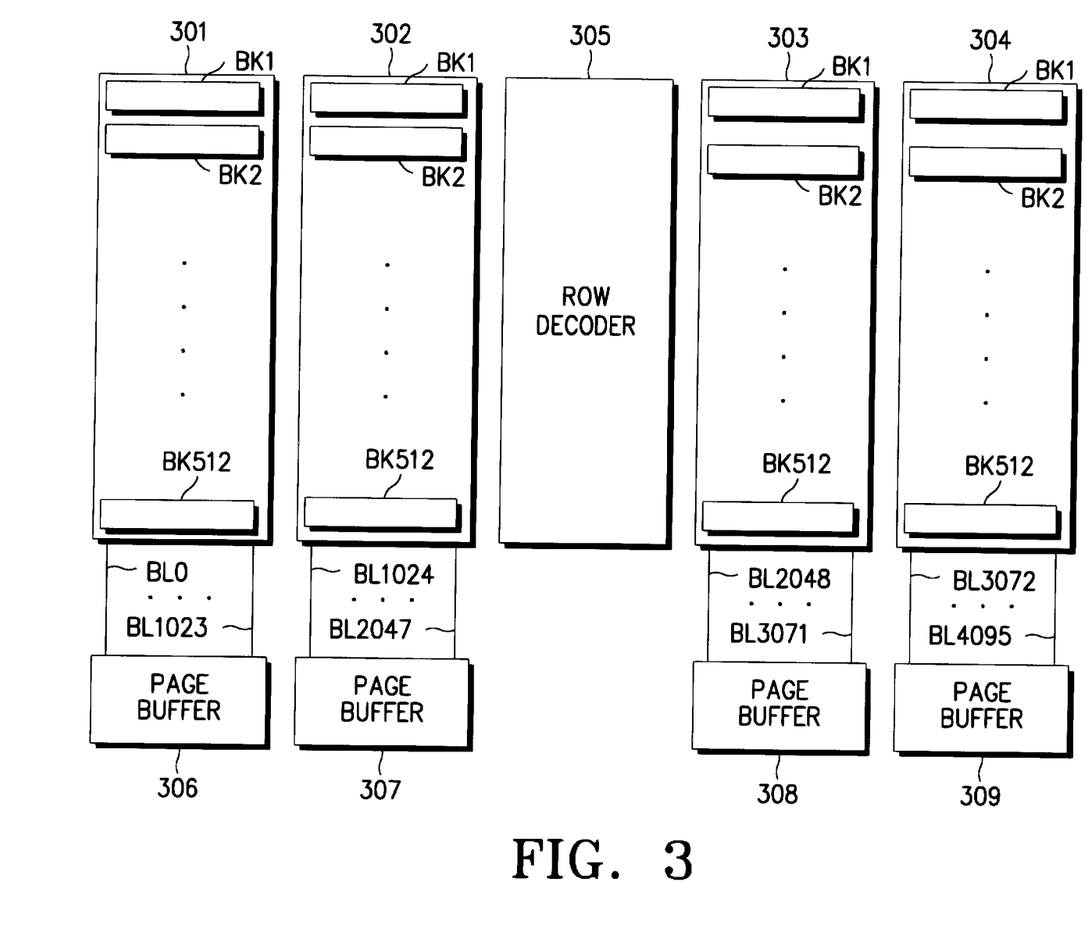
FIG. 3 is a descriptive block diagram illustrating the memory cell array and the control circuit thereof according to the first embodiment of the present invention.

FIG. 3 illustrates an embodiment of a nonvolatile memory device according to the present invention. The memory device of FIG. 3 includes a 32 Mb memory cell array that is divided into four sub-arrays 301–304 each of which is divided into 512 blocks BK1–BK512. Four page buffers 306–309 are positioned under the sub-arrays 301–304, respectively.

In the conventional memory device of FIGS. 1 and 2, a page of memory consists of all the memory cells connected to each word line. By contrast, a page of memory in the memory device of the present invention, as shown in FIG. 3, is determined by the result obtained from dividing the total number of columns by the number of the above sub-arrays. Accordingly, the sizes of the pages and the blocks can be adjusted as required by controlling the number of sub-arrays. Furthermore, row decoder 305 is centrally positioned in the middle of sub-arrays 301–304, whereby the length of the word lines, as measured from the row decoder 305 to the cell farthest from the row decoder, can be shortened by half from the length of the conventional word line. This reduces the word line resistance by half while the layout space is the same as the conventional layout.

Figure 4:
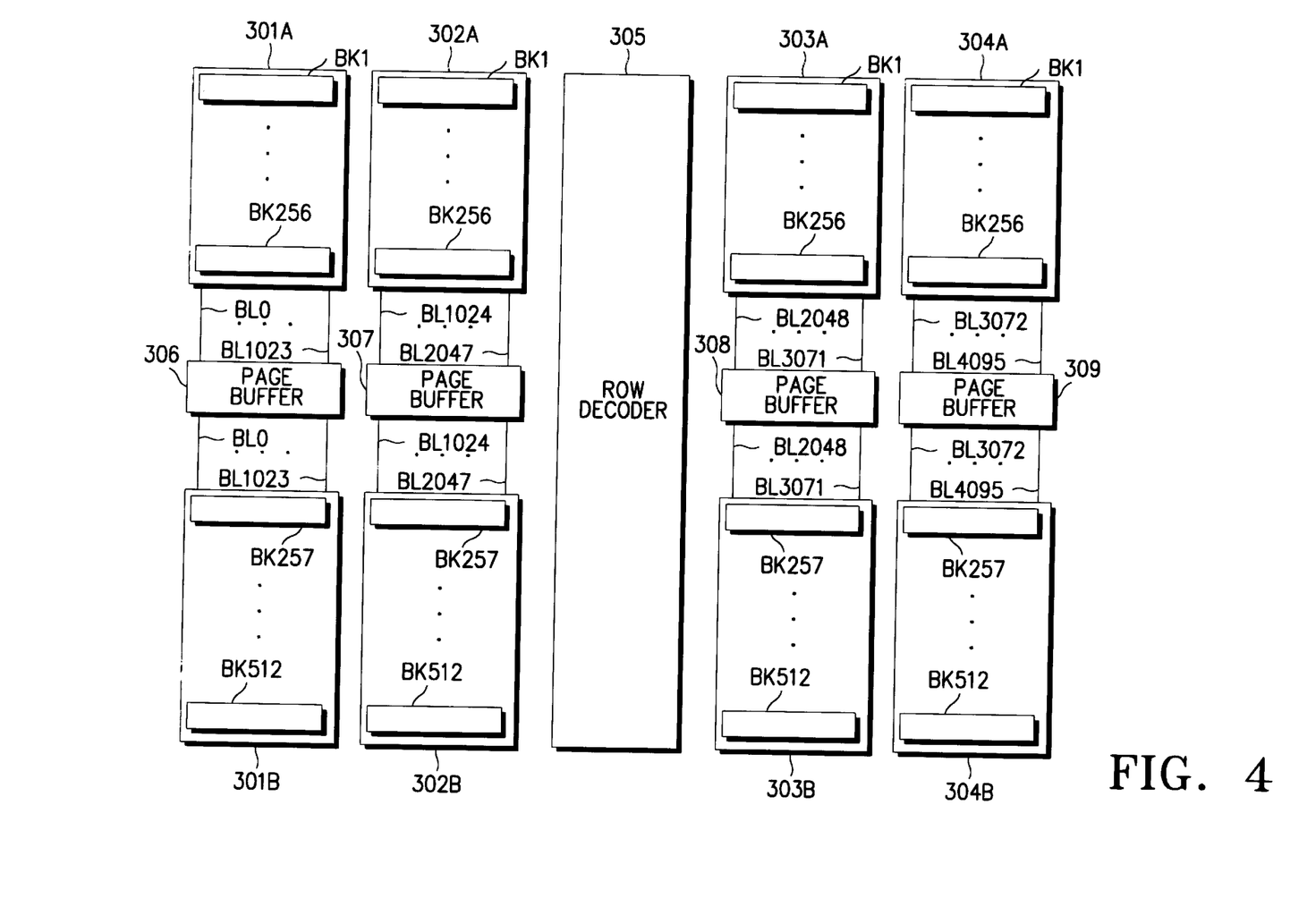
FIG. 4 is a descriptive block diagram illustrating the memory cell array and the control circuit thereof according to the second embodiment of the present invention.

Referring now to FIG. 4, which illustrates a second embodiment of a memory device according to the present invention, not only is row decoder 305 centrally located in the middle of the sub-arrays, as in the device shown in FIG. 3, but page buffers 306–309 are also centrally positioned in the middle of the memory cell arrays by dividing each sub-array in half. Placing the page buffers in the middle of the sub-arrays reduces the delay caused by the bit lines by reducing the bit line length and, therefore, also the resistance of the bit lines.

The halved sub-arrays 301A–304A and 301B–304B each include 256 row blocks respectively. Any additional peripheral circuitry (not shown in drawings) can also be positioned in the middle of the memory cell arrays for more efficient layout of the semiconductor memory device.

In addition, the row decoder 305 can be formed with an internal division into left and right row decoders each of which can separately select left and right memory cells, respectively, without having to simultaneously decode both left and right memory cells. In other words, left sub-arrays 301 and 302, and the corresponding half sub-arrays 301A, 301B, 302A and 302B, can be accessed separately from the right sub-arrays 303 and 304. This reduces the number of memory cells that must be reprogrammed in order to change data in a memory page and also reduces the power required to drive word line voltages to higher programming levels or back bias levels when performing erase and reprogramming operations.

Figure 5:
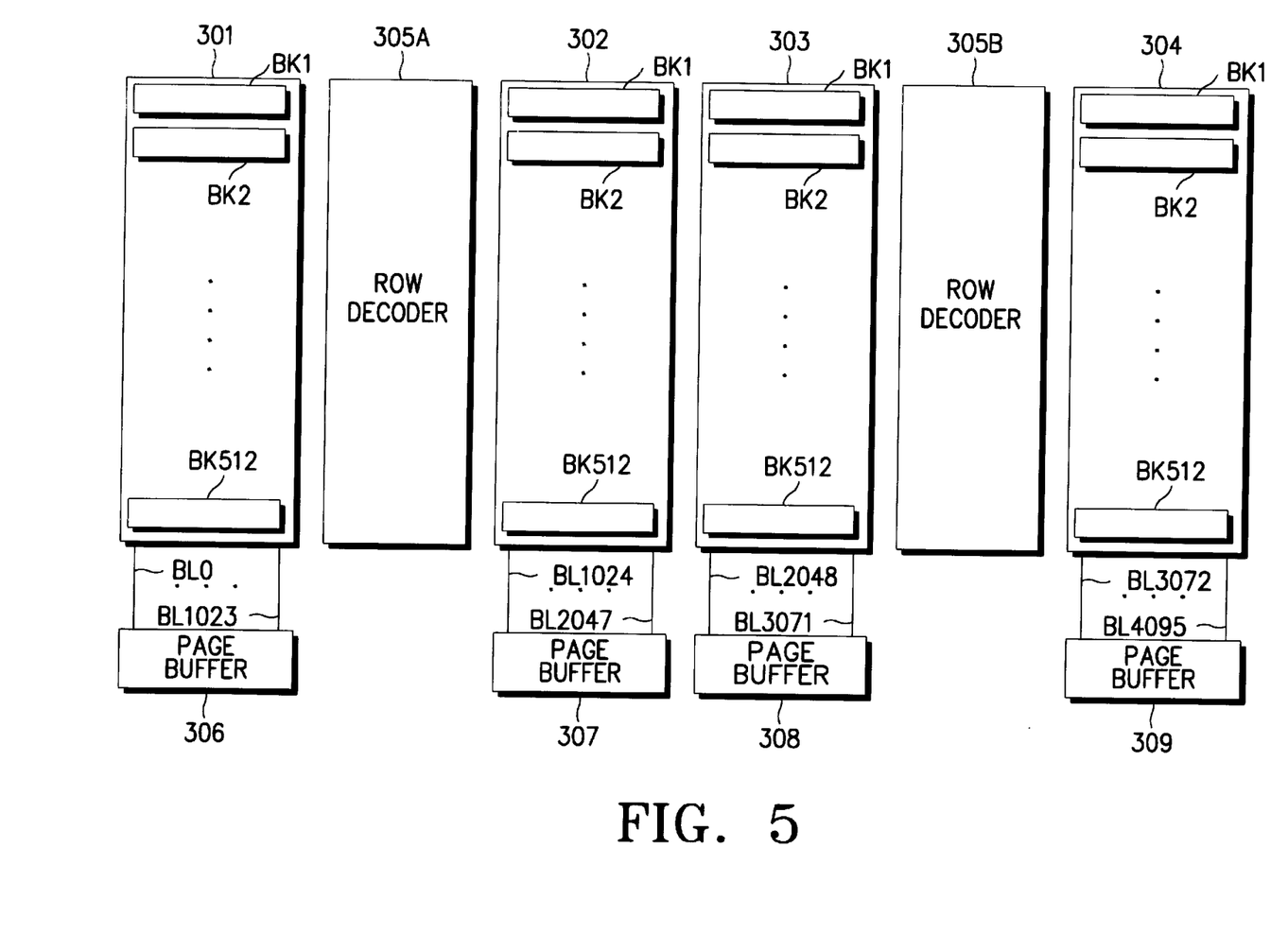
FIG. 5 is a descriptive block diagram illustrating the memory cell array and the control circuit thereof according to the third embodiment of the present invention.

Referring now to FIG. 5, which illustrates a third embodiment of the present invention, a memory device is provided having two separate row decoders 305A and 305B which control four sub-arrays 301–304. The four sub-arrays 301–304 are grouped into two sub-array groups, each consisting of two sub-arrays and a row decoder disposed between the two sub-arrays. This arrangement shortens the maximum length of the word lines from the row decoders to the memory cells to a quarter of the length of the word lines in the conventional device. Also, in order to reduce the bit line resistance, the page buffers 306–309 can be positioned in the middle of the memory cell sub-arrays, as was illustrated above with respect to the memory device shown in FIG. 4.

Accordingly, the present invention can adjust and set the number of the row decoders appropriately to divide and group the memory cell arrays into smaller cell sub-array units containing a smaller number of memory cells. In addition, the layout of the memory cell elements can be optimized so that the drawbacks and problems of the prior art can be eliminated and solved. The concepts and methods above can also be applied to reducing bit line length by increasing the number of the page buffers. Therefore, the concepts and methods of the present invention may be applied to a variety of memory cell array structures without departing from the spirit of the present invention.

Where the memory cell sub-arrays are separated, as described above, and the word lines are in common use, a common voltage or signal is applied to the word lines but different voltages and signals are applied to the respective memory cell sub-arrays. Where multiple row decoders are used for selecting memory cell sub-arrays, the operation voltages, such as the high level erase voltage, are separately applied to the word lines and the memory cell sub-arrays so that the interference problems experienced in the prior art can be eliminated.

Figure 6:
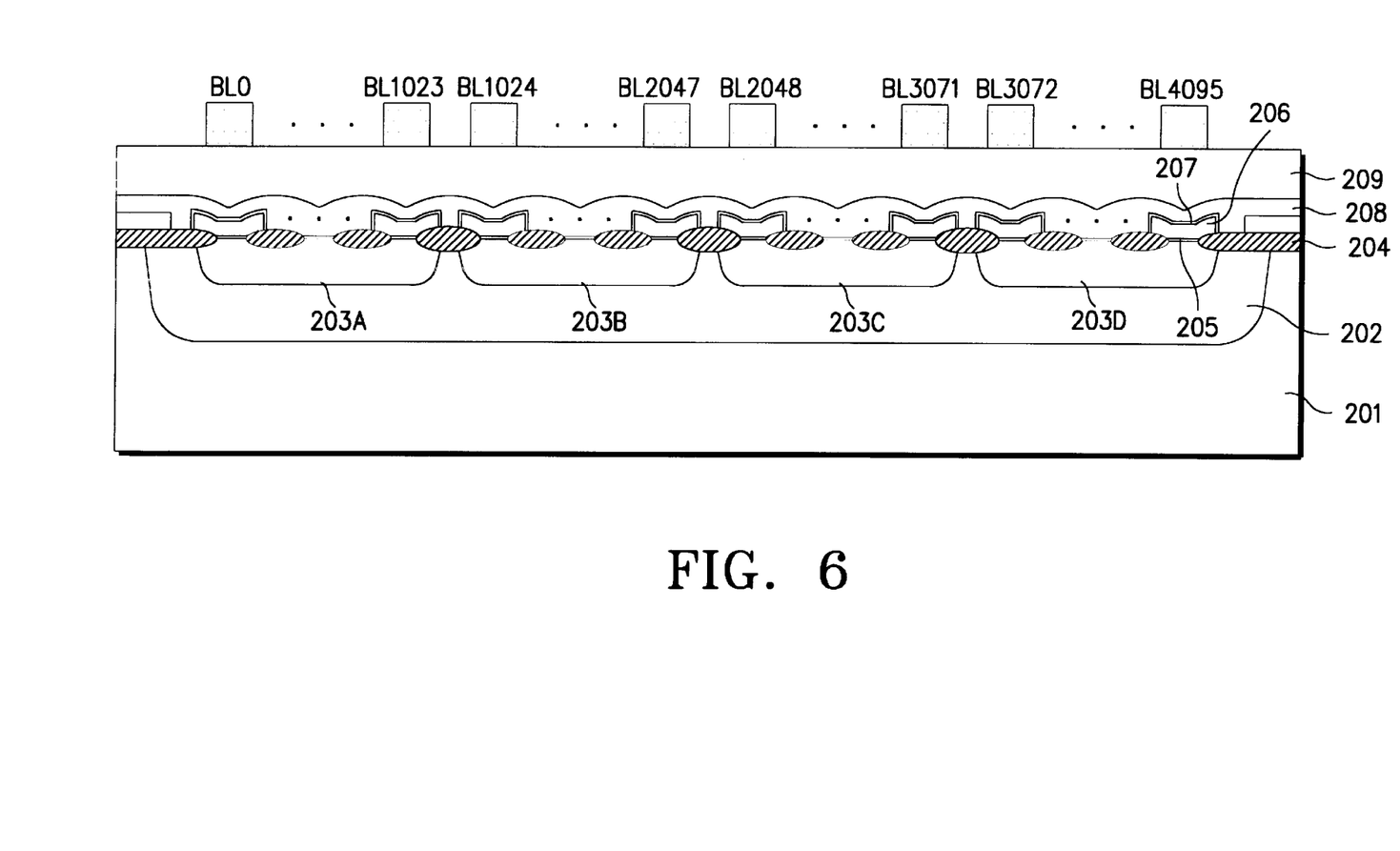
FIG. 6 is a transverse sectional view illustrating the structure of the memory cell array according to the fourth embodiment of the present invention.

Referring to FIG. 6, the memory cell array is composed of a first conductive-type well 202 formed on semiconductor substrate 201, and second conductive-type pocket wells 203A–203D formed in specified intervals within the well 202, whereby the pocket wells 203A–203D are each separated from the adjacent active regions by a field insulator film 204. In each memory cell, floating gate 206 is formed in the active region by interposing oxide film 205 between the floating gate 206 and the corresponding pocket wells 203A–203D. The control gate 208 is formed on the floating gate 206 by interposing insulator films 207 which is an ONO structure, for example. The control gates 208 for the memory cells are connected by the word lines which are insulated from the bit lines BL0, . . . ,BL4095 by the insulator film 209. Bit lines BL0, . . . ,BLA095 are each connected with the corresponding memory cells respectively.

When the high level programming voltage is applied to a word line of the device of FIG. 6 and the ground level voltage is applied to the pocket wells selected to be programmed among the pocket wells 203A–203D, a back bias, or anti-programming voltage, of 7 V, for example, is applied to the remaining pocket wells which have not been selected for programming. Only the memory cells within the selected pocket wells, to which the ground potential voltage is applied, can be selectively programmed. For an erasing operation, the ground potential voltage is applied to a word line and the high level erasing voltage is applied to one or more pocket wells selected from among the pocket wells 203A–203D. A floating voltage level, such as 0 V or preferably 4 V–14 V for example, is applied to the unselected remaining pocket wells, whereby only the memory cells are erased that are within the selected pocket wells to which the erasing voltage is applied.

As for the readout operation, the ground level voltage is applied to the pocket wells selected from among pocket wells 203A–203D, whereby the readout voltage is applied to all the memory cell bit lines within the selected pocket wells, the ground level voltage is also applied to the word line connected to the selected memory cells, and a supply voltage VCC or pass voltage VPASS is applied to the unselected remaining wordlines. The current flowing from the bit line to the source of the memory cell is read out while the floating or ground level voltage is applied to the pocket wells 203A–203D to prevent power loss. (?)

Figure 7:
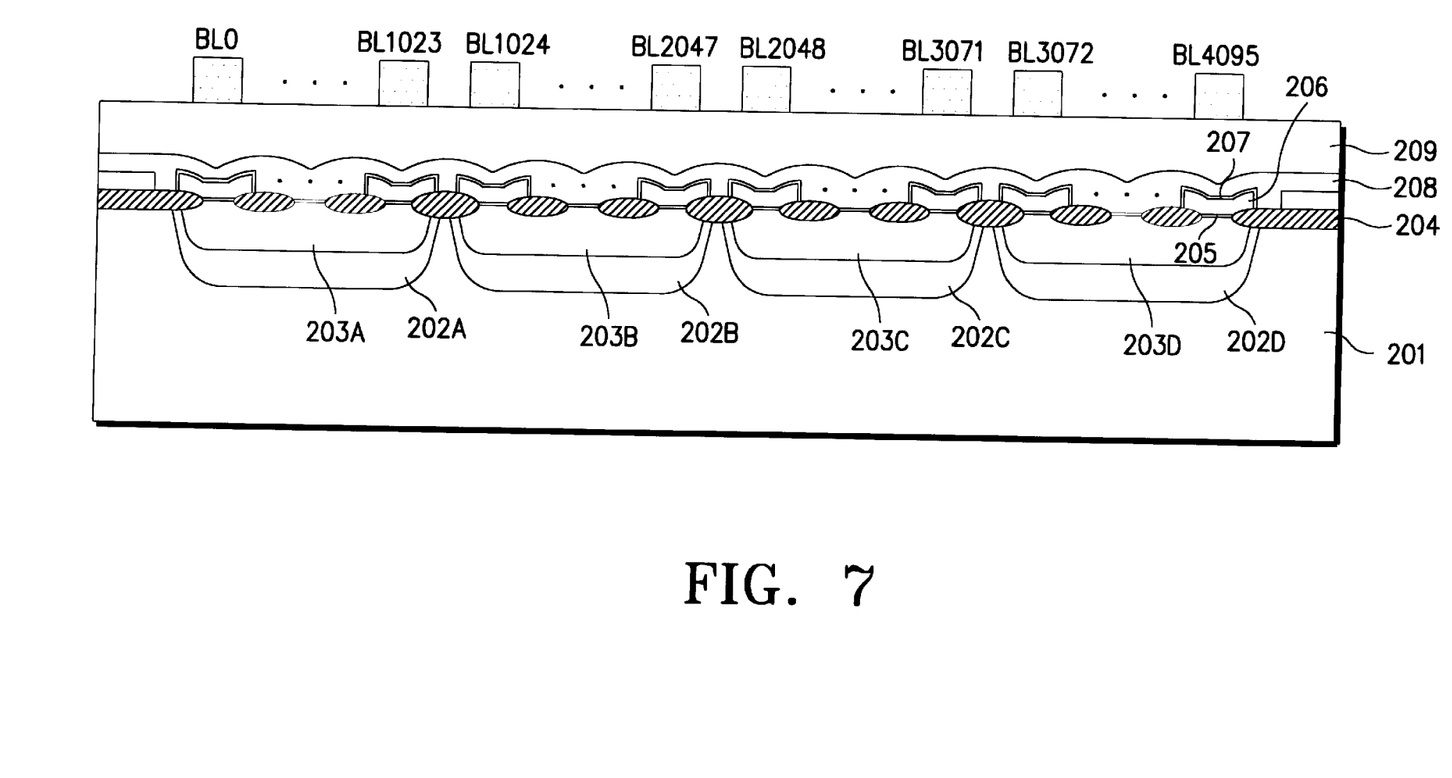
FIG. 7 is a transverse sectional view illustrating the structure of the memory cell array according to the fifth embodiment of the present invention.

FIG. 7 illustrates another embodiment of a semiconductor memory structure according to the present invention. In the structure of FIG. 7, the individual pocket wells 203A–203D are separated by respective outer pocket wells 202A–202D which surround pocket wells 203A–203D to form independent regions. The memory cells formed in each of the respective wells have the same structure and constituent elements for the memory cells as shown in FIG. 6.

In FIG. 7, each of the pocket wells 203A–203D and each of the corresponding outer pocket wells 202A–202D are grouped into respective pairs of pocket well groups so that each of the pocket well groups forms an independent pocket well unit respectively. The pocket wells 203A–203D and the outer pocket wells 202A–202D of the independent pocket well units are electrically connected with each other.

In the programming operation for the structure of FIG. 7, the ground level voltage is applied to the selected independent pocket well units 202/203A–D, and the anti-programming voltage is applied to the remaining independent pocket well units which are not to be selected for programming. Thus, only the memory cells within the selected independent pocket well units 202/203A–D can be programmed.

In order to perform an erasing operation in the structure of FIG. 7, the ground level voltage is applied to a selected word line and the erasing voltage is applied to one or more selected independent pocket well units 202/203A–D while the floating voltage is applied to the remaining independent pocket well units 202/203A–D that are not to be erased. Thus, only the memory cells belonging to the selected independent pocket well units 202/203A–D are selectively erased.

To perform a read operation on the structure of FIG. 7, the ground level voltage is applied to the selected independent pocket well units 202/203A–D, the readout voltage is applied to the bit lines connected to the memory cells of the selected independent pocket well units 202/203A–D, and the ground level voltage is applied to the word lines connected to the selected memory cells. The VCC or VPASS voltage is applied to the word lines which are not selected for reading and the current flowing from the bit lines to the source is measured. At the same time, the floating or ground level voltage is applied to the remaining independent pocket well units 202/1203A–D which have not been selected so as to prevent power loss.

The present invention improves the reliability of memory cells by reducing the number of cells that must be erased and reprogrammed in order to modify data. In addition, the power consumption required to modify data can be reduced. Furthermore, the present invention can shorten the operation time required for various memory access operations by reducing the length of row word lines and bit lines in high density, large scale integrated memory devices.

What is claimed is:

1. A nonvolatile semiconductor memory device, the memory device comprising:
    a semiconductor substrate doped with a first type of conductive impurity;
    a first well formed in the semiconductor substrate, wherein the first well is doped with a second type of conductive impurity;
    a plurality of pocket wells formed in the first well, wherein each of the plurality of pocket wells is doped with the first type of conductive impurity, and wherein each one of the plurality of pocket wells further includes a group of storage cells formed in the pocket well; and a control circuit configured to select one of the groups of storage cells formed in the plurality of pocket wells.

2. The nonvolatile semiconductor memory of claim 1, wherein each storage cell further includes:

a drain region doped with the second type of conductive impurity;

a source region;

a channel region interposed the drain and source regions;

a control gate formed adjacent to the channel region; and a floating gate interposed the control gate and channel region.

3. The nonvolatile semiconductor memory of claim 2, wherein said control circuit is further configured to select one of the groups of storage cells formed in the plurality of pockets wells for programming, apply a programming voltage to the control gate of each storage cell in the selected one of the groups of storage cells, apply a ground level voltage to the pocket well corresponding to the selected one of the groups of storage cells, and apply an anti-programming voltage to the pocket wells corresponding to nonselected ones of the groups of storage cells.

4. The nonvolatile semiconductor memory of claim 3, wherein said programming voltage is approximately 18 V and said anti-programming voltage is approximately 7 V.

5. The nonvolatile semiconductor memory of claim 2, wherein said control circuit is further configured to select one of the groups of storage cells formed in the plurality of pockets wells for erasing, apply a ground level voltage to the control gate of each storage cell in the selected one of the groups of storage cells, apply an erasing voltage to the pocket well corresponding to the selected one of the groups of storage cells, and apply a prescribed voltage to the pocket wells corresponding to nonselected ones of the groups of storage cells.

6. The nonvolatile semiconductor memory of claim 5, wherein said erasing voltage is approximately 20 V and said prescribed voltage is in the range of approximately 4 V to 14 V.

7. The nonvolatile semiconductor memory of claim 1, wherein said first type of conductive impurity is a P-type dopant and said second type of conductive impurity is an N-type dopant.

8. A nonvolatile semiconductor memory device, the memory device comprising:

a semiconductor substrate doped with a first type of conductive impurity;

a plurality of outer pocket wells formed in the semiconductor substrate, wherein each of the plurality of outer pocket wells is doped with a second type of conductive impurity;

a plurality of pocket wells wherein each one of the plurality of pocket wells is formed in one of the plurality of outer pocket wells, and further wherein each of the plurality of pocket wells is doped with the first type of conductive impurity, and wherein each one of the plurality of pocket wells further includes a group of storage cells formed in the pocket well; and a control circuit configured to select one of the groups of storage cells formed in the plurality of pocket wells.

9. The nonvolatile semiconductor memory of claim 8, wherein each storage cell further includes:

a drain region doped with the second type of conductive impurity;

a source region;

a channel region interposed the drain and source regions;

a control gate formed adjacent to the channel region; and a floating gate interposed the control gate and channel region.

10. The nonvolatile semiconductor memory of claim 9, wherein each group of storage cells includes a plurality of row blocks, wherein each one of the plurality of row blocks includes a word line coupled to the control gates of a subset of the storage cells in the group of storage cells.

11. The nonvolatile semiconductor memory of claim 10, wherein said control circuit is further configured to select one row block for programming, apply a programming voltage to the word line corresponding to the selected row block, apply a ground level voltage to the pocket well corresponding to the group containing the selected row block, and apply an anti-programming voltage to the pocket wells corresponding to groups which do not have row blocks selected for programming.

12. The nonvolatile semiconductor memory of claim 11, wherein said programming voltage is approximately 18 V and said anti-programming voltage is approximately 7 V.

13. The nonvolatile semiconductor memory of claim 10, wherein said control circuit is further configured to select one row block for erasing, apply a ground level voltage to the word line corresponding to the selected row block, apply an erasing voltage to the pocket well corresponding to the group containing the selected row block, and apply a prescribed voltage to the pocket wells corresponding to groups which do not have row blocks selected for erasing.

14. The nonvolatile semiconductor memory of claim 13, wherein said erasing voltage is approximately 20 V while said prescribed voltage is in the range of approximately 4 V to 14 V.

15. The nonvolatile semiconductor memory of claim 9, wherein said first type of conductive impurity is a P-type dopant and said second type of conductive impurity is an N-type dopant.

* * * * *

UNITED STATES PATENT AND TRADEMARK OFFICE
CERTIFICATE OF CORRECTION

PATENT NO.    : 5,886,924
DATED         : March 23, 1999
INVENTOR(S)   : Kim et al.

It is certified that error appears in the above-identified patent and that said Letters Patent is hereby corrected as shown below:

Column 7,
Line 42, "BLA095" should read -- BL4095 --.

Column 8,
Line 48, "202/1203A-D" should read -- 202/203A-D --.

Signed and Sealed this

Fourth Day of February, 2003

JAMES E. ROGAN
*Director of the United States Patent and Trademark Office*